United States Patent [19]

Morris et al.

[11] Patent Number: 4,645,948

[45] Date of Patent: Feb. 24, 1987

[54] FIELD EFFECT TRANSISTOR CURRENT SOURCE

[75] Inventors: Bernard L. Morris, Allentown; Jeffrey J. Nagy, Whitehall Township, Lehigh County; Lawrence A. Walter, Lower Macungie Township, Lehigh County, all of Pa.

[73] Assignee: AT&T Bell Laboratories, Murray Hill, N.J.

[21] Appl. No.: 656,343

[22] Filed: Oct. 1, 1984

[51] Int. Cl.⁴ .................... H03K 3/01; H03K 17/687; H03K 3/26

[52] U.S. Cl. ................................ 307/296 R; 307/297; 307/571; 307/310; 357/51

[58] Field of Search ............... 307/297, 296, 310, 580, 307/571; 323/312; 330/288; 357/51

[56] References Cited

U.S. PATENT DOCUMENTS

| | | | |
|---|---|---|---|
| 3,328,685 | 6/1967 | Hewlett | 324/62 |
| 3,483,464 | 12/1969 | Embree et al. | 323/22 |
| 3,813,595 | 5/1974 | Sheng | 323/4 |
| 3,875,430 | 4/1975 | Prak | 307/297 |
| 4,009,432 | 2/1977 | Dingwall et al. | 323/4 |
| 4,051,392 | 9/1977 | Rosenthal et al. | 307/297 |
| 4,053,915 | 10/1977 | Cave | 357/22 |
| 4,207,537 | 6/1980 | Cave et al. | 330/253 |
| 4,275,347 | 6/1981 | Farmer, Jr. et al. | 323/312 |
| 4,287,438 | 9/1981 | Cave et al. | 307/297 |

OTHER PUBLICATIONS

"Constant Current Source Network", by U. G. Baitinger et al, IBM Tech. Disclosure Bulletin, vol. 13, No. 2/1971, p. 2516.

Designing with Field Effect Transistors Siliconix, Inc., McGraw Hill, 1981, p. 138.

"Temperature and Power Supply Stable Current Source", Kim-Zimany Case 3-2 Application, Ser. No. 593,522, filed 3-26-84, pp. 1-12, 1 drawing.

"A Simple NMOS Constant Voltage and Current Source", Microelectronics Journal, vol. 14, No. 4, M. R. Haskard, 1983, pp. 31-37.

*Introduction to Solid State Physics,* Second Edition, C. Kittel, 1956, p. 365.

"Temperature Dependence of MOS Transistor Characteristics Below Saturation", *IEEE Transactions on Electron Devices,* vol. ED-13, No. 12, L. Vadasz et al, 1966, pp. 863-866.

"Threshold Voltage Variations with Temperature in MOS Transistors", *IEEE Transactions on Electron Devices,* T. A. DeMassa et al, 1971, pp. 386-388.

*Primary Examiner*—Stanley D. Miller
*Assistant Examiner*—B. P. Davis
*Attorney, Agent, or Firm*—James H. Fox

[57] ABSTRACT

A field effect transistor circuit generates a reference current that can obtain a desired temperature coefficient. The circuit is self-compensatory with respect to process variations, in that a "slow" process will produce a higher than normal current, while a "fast" process will give a lower one. This results in a tight spread of slew-rate, gain, gain-bandwidth, etc. in opamps, comparators, and other linear circuits. A simple adjustment in the circuit allows the temperature coefficient to be made positive or negative if so desired. An illustrative circuit is shown for CMOS technology, but can be applied to other field effect technologies.

22 Claims, 12 Drawing Figures

FIELD OXIDE DEFINED RESISTOR, TOP VIEW
(PRIOR ART)

FIELD OXIDE DEFINED RESISTOR, CROSS SECTION
(PRIOR ART)

POLY DEFINED RESISTOR, TOP VIEW

NOMINAL POLY

WIDE POLY

FIELD EFFECT TRANSISTOR CURRENT SOURCE

BACKGROUND OF THE INVENTION

1. Field of the Invention

The present invention relates to a technique for implementing a current source in field effect transistor technology.

2. Description of the Prior Art

Most linear circuits are biased by means of a current source. It is usually thought desirable that this source provide a current that is independent of temperature, power supply, and process variations. One current source in common use takes advantage of the logarithmic insensitivity of a bipolar transistor's forward base-emitter voltage, VBE, to power supply and process variations. A resistor placed across the emitter-base junction of an active transistor (FIG. 1) will give a reference current equal to VBE/R. CMOS (Complementary Metal-Oxide-Semiconductor) integrated circuits have also used this technique by taking advantage of the intrinsic bipolar transistor in the CMOS structure. Unfortunately, this current source has a large temperature dependence, since VBE has an intrinsic negative temperature coefficient of approximately $-2$ mv/degree C., and the resistor has a positive temperature coefficient. Hence, the current from this source has a large negative temperature coefficient.

A great deal of work has been done on circuits that provide a constant reference voltage, but relatively less on the apparently similar job of producing a constant reference current. In the case of field effect transistor (FET) current sources, steps are frequently taken to mitigate the effects of large lot-to-lot variations in device parameters, for which field effect transistors are notorious. In particular, circuits are usually designed to minimize the effects of threshold and gain variations that occur for field effect transistors on different wafers. For example, a resistor is typically included in the source path of a FET to provide degenerative feedback, which reduces these variations.

SUMMARY OF THE INVENTION

We have invented a technique for implementing a constant current source using a field effect transistor. In this technique, a field effect transistor having a resistor connected between the gate and source electrodes provides a reference current that can be made to have a positive, negative, or zero temperature coefficient. When utilized with analog or digital field effect transistor circuitry implemented on the same semiconductor substrate, the reference circuit also compensates for processing variations.

DETAILED DESCRIPTION

The following description relates to a circuit which can provide a temperature and power supply independent current, and in a preferred embodiment actively compensates for inherent process variations. This results in a smaller spread of linear circuit parameters, such as operational amplifier slew rate, gain, and gain-bandwidth, than can be obtained with an "ideal" current source. The present technique results in part from a recognition that positive and negative temperature coefficient terms can be balanced to a desired degree in a FET, to obtain a desired temperature coefficient. The present invention also provides that the current source FET may be fabricated by the same fabrication process (e.g., on the same semiconductor substrate) as the circuits utilizing the controlled current. Then, process variations produce changes in the current source FET that offset changes in performance parameters (e.g., gain, slew rate, etc.) in the controlled circuit. By this technique, a FET is utilized to good advantage as a current source.

Figure 1:
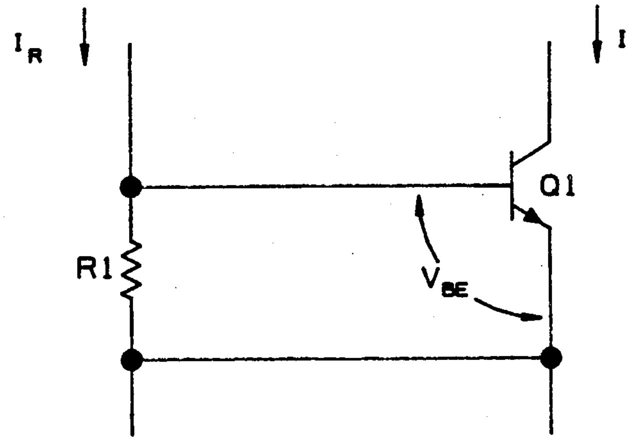
FIGURE 1 (PRIOR ART)
FIG. 1 illustrates a prior-art bipolar current source.
Figure 2:
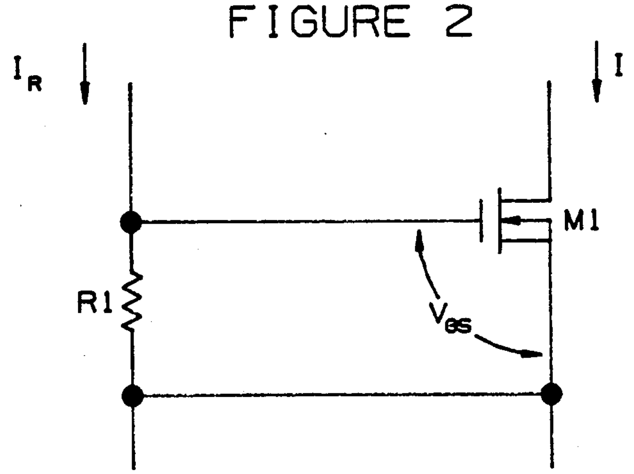
FIG. 2 illustrates a field effect transistor current source reference circuit according to the present invention.

The basic core of the source is shown in FIG. 2, wherein a field effect transistor has a reference resistor (R) connected between the gate and the source. The field effect transistor is typically an insulated gate type (i.e., an IGFET), which may be a metal-oxide-silicon field effect transistor (MOSFET) type. In the saturation region, the current through the channel of the IGFET is:

$$I = \tfrac{1}{2}\beta(VGS - Vt)^2 \quad (1)$$

where $\beta$ is the gain, and Vt is the threshold voltage, of the IGFET. For a MOSFET, the gain ($\beta$) may be approximated as $\beta=(Z/L)\mu Cox$, wherein Z is the width of the channel, L is the length of the channel, $\mu$ is the mobility of majority carriers in the channel, and Cox is the gate capacitance per unit area. The value of Cox can be calculated as: The permittivity of free space times the dielectric constant of the gate insulator (about 3.85 for an oxide) divided by the thickness of the gate insulator. Equation (1) may be solved for VGS:

$$VGS = (2I/\beta)^{\frac{1}{2}} + Vt. \quad (2)$$

For a constant channel current I, the temperature coefficient of VGS is the sum of two terms. The first involves $\beta$, whose temperature dependence arises from that of the mobility of the majority carriers flowing in the channel between the source and the drain. The mobility ($\mu$) is limited by lattice scattering, which has a temperature dependence of:

$$\mu = \mu_o(T/To)^{-3/2} \quad (3)$$

where $\mu_o$ is the mobility at temperature To. Typical values of $\mu_o$ range from 520 to 775 $cm^2$/volt-sec for n-channel FET's, and from 185–240 $cm^2$/volt-sec for p-channel FET's at To=20° C. In practice, surface scattering changes the exponent somewhat from its theoretical value of $-3/2$.

The threshold voltage (Vt) has an intrinsic negative temperature coefficient that depends only weakly on process parameters. For a typical Complementary MOS (CMOS) technology based upon 3-5 micrometer design rules, this value is $-2.3$ mv/degree C. Equation (2) can now be written as:

$$VGS = Vt + (2I/\beta_o)^{\frac{1}{2}}(T/To)^{\frac{3}{4}}. \quad (4)$$

Note that $\beta_o$ is the gain at temperature To. It is now apparent that VGS is the sum of the two terms with opposing temperature coefficients; that of $\beta_o$ being positive, and Vt being negative. In addition, the magnitude of the second term in Equation (4) depends on the channel current, so that the total temperature coefficient of VGS can easily be adjusted. (A complete analytical treatment is included in the Appendix.) Since the reference current $I_R = VGS/R$, it is apparent that the desired temperature coefficient of the reference current can be obtained by choosing one or more of: the threshold voltage (Vt), the channel current (I), and the gain ($\beta$). The gain in turn can be set according to considerations known in the art, including, for example, the approximation given above.

The ability of this source to compensate for process variations is also shown in Equation 4. A "fast" (e.g., relatively thin gate oxide and short channel length) process will have a large $\beta$, and thus a small value of VGS. The reference current ($I_R$) is equal to VGS/R, so it will decrease. A "slow" (e.g., relatively thick gate oxide and long channel length) process with a small $\beta$ will have a larger VGS, and thus a larger reference current. In terms of the physical process, a fast process usually results from relatively more etching of the gate material, which reduces its length relatively more than is width. Hence, when the channel is formed, the ratio Z/L is increased. The opposite is true for a slow process. Other factors may also be involved, such as semiconductor junction depths, gate insulator thicknesses, doping levels, etc.

Figure 3:
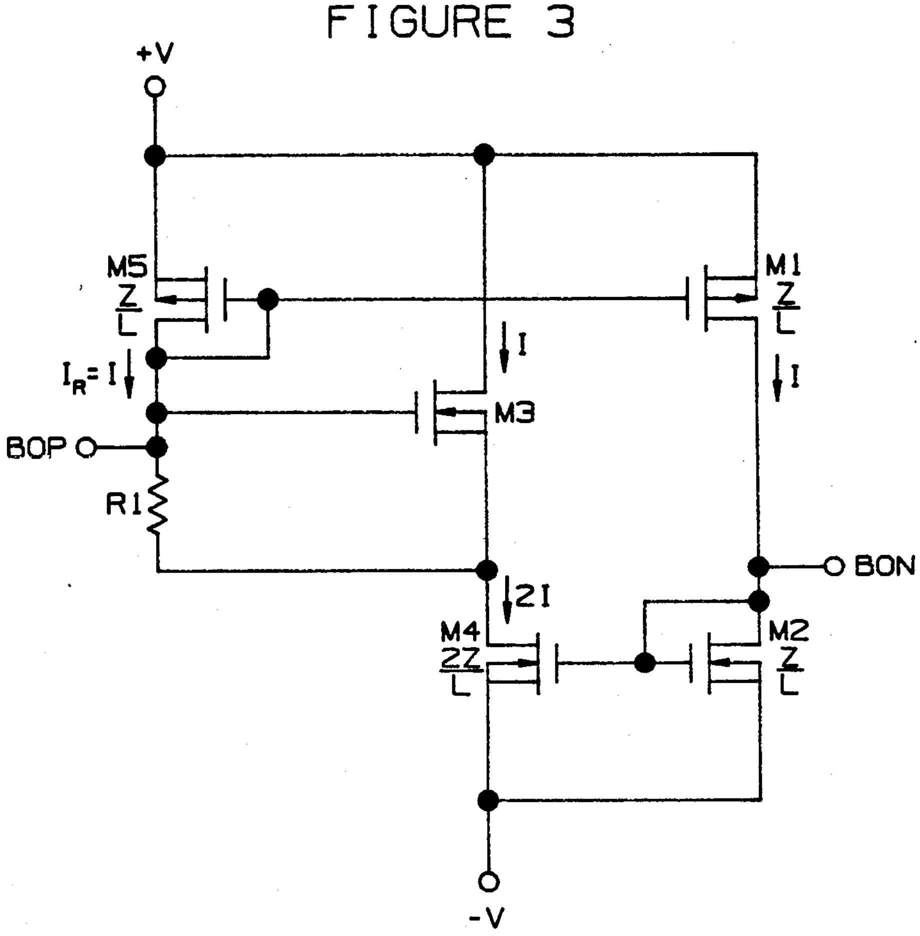
FIG. 3 illustrates a first circuit for implementing the present invention.
Figure 5:
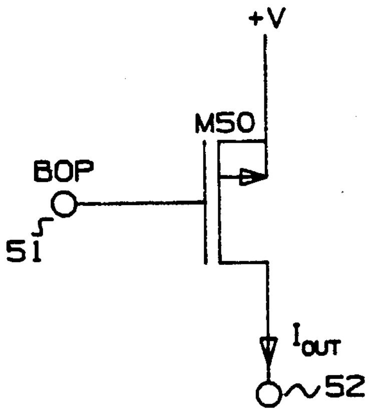
FIGS. 5 and 6 show controlled transistors for implementing current sources relative to positive and negative voltage terminals, respectively.
Figure 6:
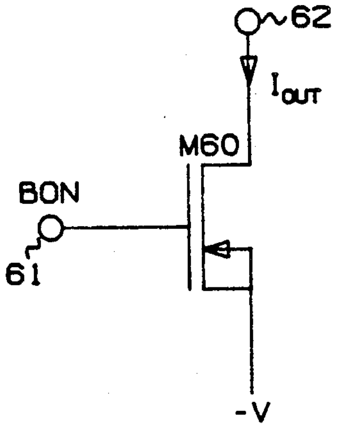

A simple circuit that uses the VGS/R concept to generate a constant current is shown in FIG. 3. To obtain a desired temperature coefficient (TC), the channel current through the reference transistor (M3) should be held proportional to the reference current ($I_R$). For this purpose, transistor M1 mirrors the channel current in M5, which is connected as a diode. This channel current is also the reference current flowing through R1. If a current I is flowing in M1 and M5, then current 2I is mirrored in M4, which is twice the size of M2. The channel current in reference transistor M3 is equal to that in M4 minus that delivered by M5. The final result is that a current I flows through all the transistors except M4, which has a current of 2I. Since the channel current through M3 is forced to be equal to the reference current in R1, a stable feedback loop is formed. In general, these currents need not be equal, but merely proportional. Then, the current mirrors are means for causing the channel current in the reference transistor to be proportional to the reference current through the reference resistor. Two output bias voltages are available from this circuit. The bias-out positive (BOP) provides a voltage to the gate of one or more P-channel current output transistors M50; see FIG. 5. The output current, $I_{out}$, is proportional to the reference current, $I_R$. The proportionality constant depends upon the size of M50 as compared to M5 of FIG. 3 (or as compared to M48 of FIG. 4). A corresponding bias-out negative (BON) can be supplied to one or more N-channel current output transistors M60; see FIG. 6. However, the circuit of FIG. 3 has two stable current states, one of them $I=0$. Hence it is desirable to include means to prevent the circuit from reaching the $I=0$ state.

Figure 4:
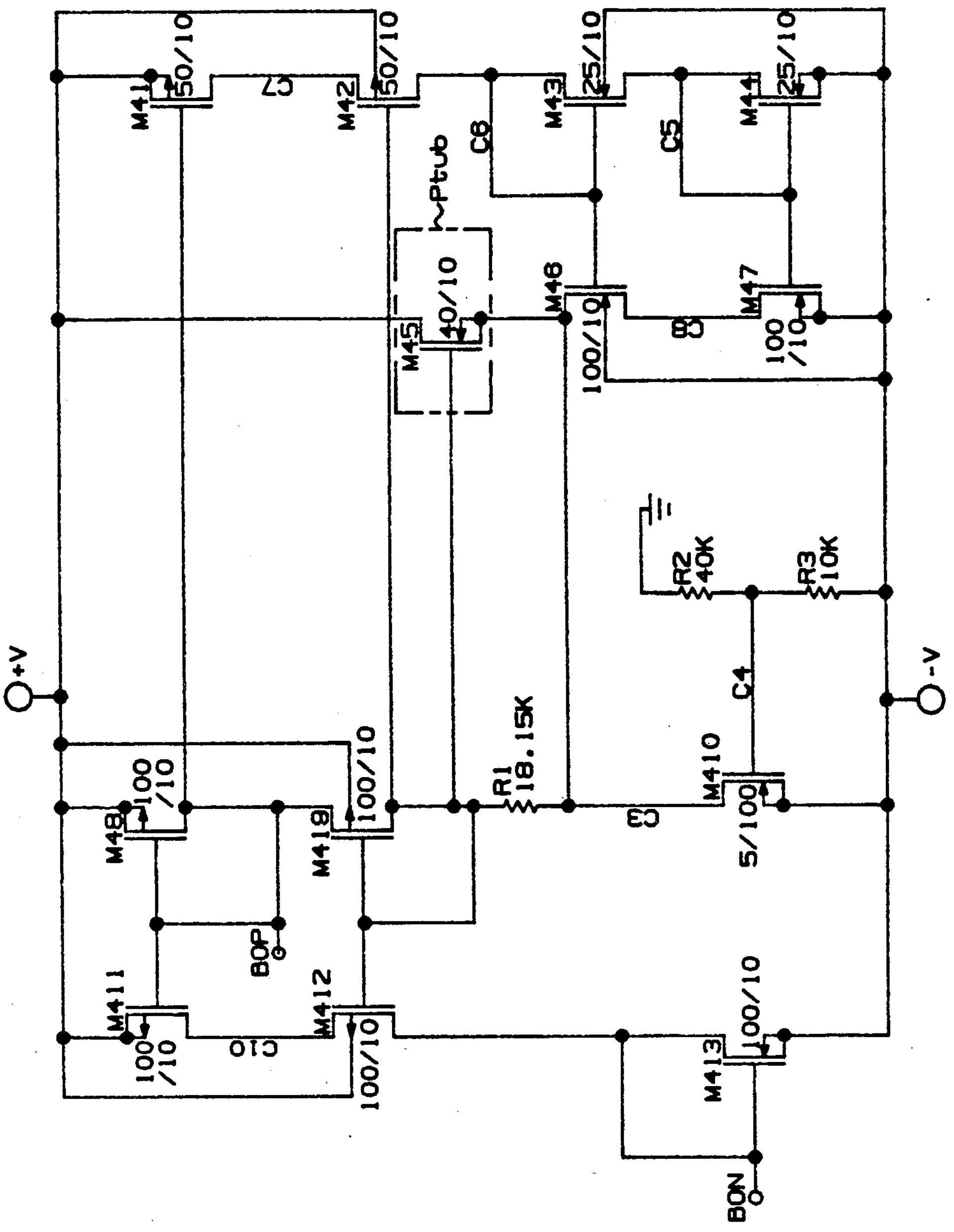
FIG. 4 illustrates a second circuit for implementing the present invention.

A more typical circuit employing the inventive concept is shown in FIG. 4. The widths and lengths of the transistor channels, in micrometers, is given as W/L for each associated transistor. Transistor M410 and its bias resistors are included to provide proper start-up conditions; i.e., prevent $I=0$. For this purpose, M410 is sized to draw a small current, typically less than 0.1% of the current through reference resistor R1, which is set at a nominal value of 100 μa. M410 and its bias resistors can be replaced by a depletion transistor. The other additional transistors are optionally included to improve power supply rejection by cascading all of the mirrors, and to mirror the current to M413, which actually drives the negative bias output (BON). A positive bias output (BOP) is provided from the drain of M48.

The reference resistor R1 can be of any type that gives a positive temperature coefficient of resistance. It is advantageously made with a P+ diffusion, which has a much lower TCR (temperature coefficient of resistivity) and VCR (voltage coefficient of resistivity) than the P-tub. The absolute control of the P+ sheet resistance is also very good, typically within plus or minus 15% of the nominal value. R1 can alternately be made of polysilicon or other material. The sizes of R1 and reference transistor M45 are typically set to give a zero TCC (temperature coefficient of current) in M413 and M48 at nominal conditions. The resistance of the reference resistor (R1) is typically greater than 100 ohms, and typically less than 10 megaohms, although a wider range is possible. The size of the reference transistor (M45) is desirably chosen so that the channel length (L) is large enough to minimize processing variations. A length of about 8 to 10 micrometers is suitable for typical processing conditions. Then, the gain may be set by choosing the width, Z, to give the desired temperature coefficient. One methodology for obtaining the desired temperature coefficient of the current from the source is as follows:

1. Determine the temperature coefficient of the reference resistor (e.g., by measurement or estimates based on material type).
2. Choose a desired reference current (e.g., $I_R=100$ microamps) and a desired proportionality between channel current in the reference transistor to the reference current (e.g., $(I/I_R=1)$).
3. Estimate the approximate size of the reference transistor (e.g., W=50 micrometers, L=10 micrometers).
4. Determine Vt and $\beta$ for the reference transistor thus selected.
5. Determine VGS for the reference transistor, as from equation (2) (e.g., VGS=1.7 volts).
6. Set reference resistor $R=VGS/I_R$ (e.g., $1.7/100\times10^{-6}=17K$).
7. Calculate the temperature coefficient of the reference current: (i.e., $I_R=VGS/R$) from 1 above and equation (2).
8. If the $I_R$ temperature coefficient is not within desired limits, change a variable reflected in equation (2), and repeat steps 3-7 until desired value obtained (e.g., decrease size of reference transistor to W=40 micrometers L=10 micrometers, which reduces the value of $\beta$, and increases VGS to 1.815 volts, so that R=18.15K, which produces approximately zero T.C. for $I_R$).

Note that a positive, zero, or negative T.C. for $I_R$ can be thus obtained. Other methodologies are also possible.

Note that in FIG. 4, the reference transistor M45 as shown is in its own P-tub, with the back-gate bias, VBS=0. This is desirable to minimize power supply induced variations on the back gate. For this reason, the circuit performance is typically better in CMOS than it would be in NMOS. If a CMOS technology using isolated N-tubs were used, the entire circuit would simply be "flipped" over vertically, and M45 would be a P-channel device in an isolated N-tub. However, the present technique can also be usefully implemented in NMOS (or PMOS) technology, when isolated tubs are not available. In that case, the backgate of the current control transistor is then connected to the semiconductor substrate, which is connected to the negative (N-channel) or positive (P-channel) power supply terminal.

To compare the present technique with prior art techniques, computer simulations were done on four different current sources. The nominal current at 25° C. was set at 100 μa for all four sources. The effect of temperature on these sources, as well as process variations for both low speed (worst-case slow) and high speed (worst-case fast) conditions, were investigated. The four sources were as follows:

Source A: 100 μa ideal source

Source B: Band-gap source, $I=VBG/R$, VBG=1.2 volts

Source C: VBE/R source

Source D: VGS/R source (FIG. 4)

In sources B–D, the resistor R was assumed to be made with P+ diffusion, and to have a plus or minus 15% maximum variation with processing.

Varying the temperature from 0° to 100° C. showed that the VBE/R source has by far the largest temperature variation. However, the band-gap source (B) also has an appreciable TCC due to the finite TCR of the resistor. The self-compensating feature of the VGS/R source was apparent. At 25°, the low speed process gives 35% higher current, and the high speed process 30% lower current than nominal. Both cases show a larger TCC than exists with the nominal process, but no worse than that of the bandgap source (B).

The effect of the different current sources on the performance of a typical operational amplifier (op-amp) has also been investigated. The op-amp used in these simulations was a simple two stage design.

There are two independent effects of temperature on op-amp performance. The first is the intrinsic effect of temperature on the op-amp, *indepedent of current.* The second is the effect of current variations due to the *temperature dependence of the current source.* The ideal current source (A) is used in these simulations to separate these two effects. The slew rate, gain-bandwidth product (GBW), and gain, as a function of temperature, were investigated for nominal processing at a constant current of 100 μa.

The effect of current variation on these same parameters was also investigated for "worst case (W-C) fast" and "worst case (W-C) slow" conditions, as follows:

| Condition | Transistors | Resistors | Temperature |
|---|---|---|---|
| W-C Fast | Fast | 15% Low | 0 Degrees C |
| W-C Slow | Slow | 15% High | 100 Degrees C |

The minimum and maximum values, and the total spread expressed as a % of the median value of the three parameters, are summed up in Table I.

TABLE I

Maximum, minimum, and total spread of slew rate, GBW, and gain of an op-amp under worst case fast and worst-case slow conditions:

| CURRENT SOURCE | SLEW RATE (v/us) Min. | Max. | Spread (%) | GBW (MHz) Min. | Max. | Spread (%) | GAIN (dB) Min. | Max. | Spread (%) |
|---|---|---|---|---|---|---|---|---|---|
| A. Constant | 10.3 | 13.5 | 27 | 3.83 | 6.95 | 58 | 63.6 | 70.5 | 10.4 |
| B. Band-Gap | 9.2 | 15.5 | 49 | 3.58 | 7.36 | 69 | 63.1 | 71.3 | 12.1 |
| C. VBE/R | 7.5 | 16.1 | 73 | 3.52 | 7.63 | 73 | 62.7 | 72.3 | 14.3 |
| D. VGS/R | 11.6 | 12.8 | 10 | 4.08 | 6.66 | 48 | 63.9 | 69.6 | 8.6 |

The performance improvement is môst noticeable in those parameters which have the strongest dependence on current, but in all cases the VGS/R source results in a higher minimum value and a lower maximum value. Some insight as to the relative effects of temperature and process variations can be gained by independently varying these inputs while keeping the reference current set at 100 μa. The results are shown in Table II. Both the slew rate and gain are more strongly effected by the process variations than by temperature, while the GBW is equally effected.

TABLE II

Total variations in op-amp performance due to (1) a 100° C. temperature variation, and (2) the difference between "fast" and "slow" transistor processing, with the reference current held at 100 μa:

| PARAMETER | VARIATION DUE TO TEMPERATURE (%) | VARIATION DUE TO PROCESSING (%) |
|---|---|---|
| Slew Rate | 7.8 | 15.5 |
| Gain | 1.3 | 13.8 |
| GBW | 27.0 | 28.0 |

Among the other parameters of interest in op-amps and other linear circuits are power supply rejection ratio (PSRR), common mode rejection ratio (CMRR), and common mode range. Computer simulations show that the inventive (VGS/R) supply is slightly better than the others in both PSRR and CMRR. The common mode range, however, is somewhat worse. This is due to exactly the self-compensating feature that improves the other parameters. The smallest common mode range exists when the transistors are slow and the current is high. In other current sources there is no connection between these two; even when the worst-case assumption of high current is made, it is not as high as it is in the self-compensating source. For the op-amp used here, this results in a worst-case loss of 500 mv of input range. This op-amp was not designed to give a particularly large common mode range, and the loss would be proportionally less on op-amps with larger Z/L ratios on the input transistors.

Figure 7:
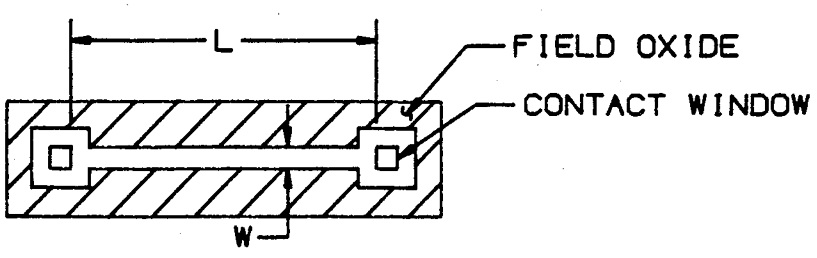
FIGS. 7 and 8 illustrate a prior art current source reference resistor.
Figure 8:
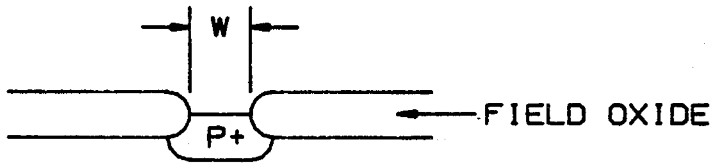

All of the discussion and results up to this point has assumed that the value of the reference resistor R in the VGS/R current source is independent of the transistor process. This is a good assumption for resistors made in the usual manner, as shown in FIGS. 7 and 8. In this technique, an opening etched in the field oxide allows the resistor to be formed by doping (as by ion implantation) the semiconductor in the region thus defined. For the resistor shown in FIGS. 7, the total resistance is:

$$R=Rs(L/W) \quad (5)$$

where Rs is the sheet resistance of the doped semiconductor, and L and W are the length and width of the field oxide defined opening. An insulating layer (e.g., a glass), is typically deposited over the resistor, with contact windows then etched therethrough.

Figure 9:
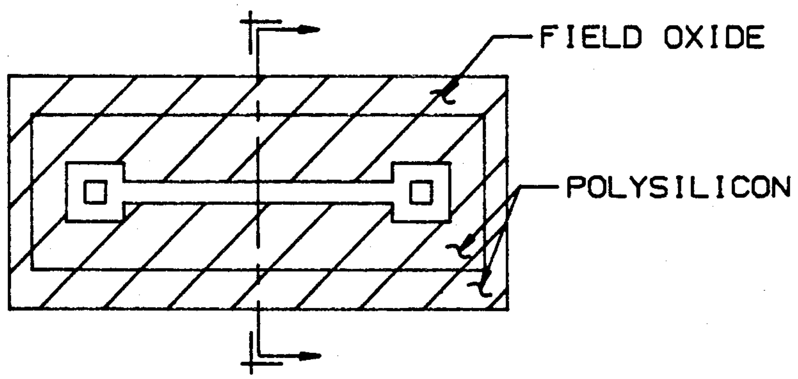
FIGS. 9, 10, and 11 illustrate an inventive current source reference resistor.
Figure 10:
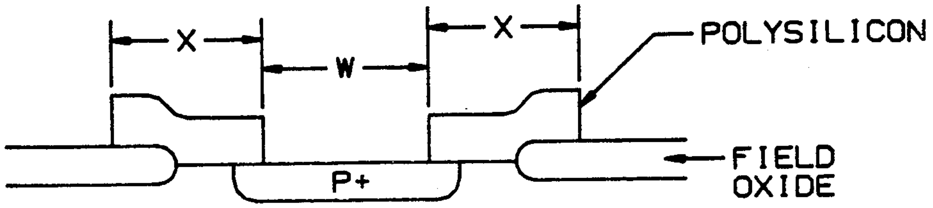
Figure 11:
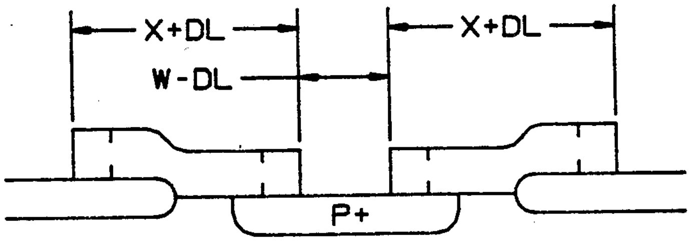

Another way to define the resistor is shown in FIGS. 9 and 10. In this case, the polysilicon (poly) level is used instead of the field oxide to define the feature size. The poly line size is one of the most critical and well controlled parameters in the process, and in self-aligned silicon gate technology, the polysilicon layer defines the gate electrode size. Hence, the poly line size will often determine whether any given wafer is "slow" or "fast". For this reason, a resistor defined by the layer that defines the gate electrode can have a tighter design tolerance than one defined by the field oxide. Let us assume that the actual poly line size differs from the nominal size by an amount DL. A positive DL means wider poly and a slower process, negative DL means narrow poly and a fast process. As shown in FIG. 11, the resistor width is W−DL, so that:

$$R=Rs(L/(W-DL)) \quad (6)$$

A positive DL (slow process) causes the resistor to increase, and the negative DL (fast process) causes it to decrease from the design value. This will oppose the "self-compensation" feature of the VGS/R source, since process induced changes in VGS will now be tracked by a similar change in R. The relative value of these two quantities depends on the resistor's nominal width. For an extremely wide resistor, R does not depend on DL at all. As the resistor width decreases, the effect of DL becomes larger. Note that other self-aligned gate electrode materials (e.g., a refractory metal or metal silicide) can be used to define the resistor, to achieve this effect.

Figure 12:
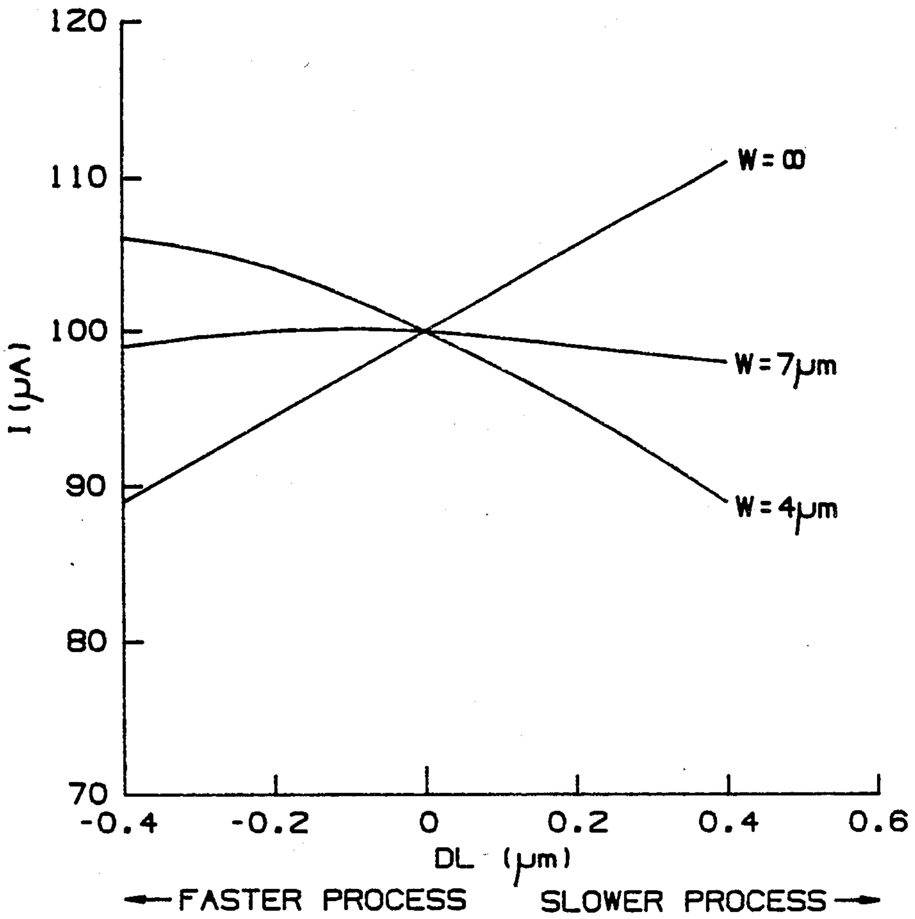
FIG. 12 illustrates the effect of process variations on current source output for reference resistors of differing widths for the resistor type shown in FIGS. 9–11.

The current $I=VGS/R$ for three different resistor widths is shown in FIG. 12. It was calculated using the 40/10 N-channel transistor N45 in FIG. 4 and nominal process conditions. The case of infinite resistor width corresponds to the case discussed above. At 7 microns the current is nearly independent of poly line size, and at 4 microns the process compensation is actually the reverse of that discussed above.

The circuit shown in FIG. 4 has been implemented in a typical 3.5 micron Twin-Tub CMOS process on a n-type substrate on a lot in which the poly width was intentionally varied. The resistor R1 was poly defined, with a nominal width of 4 microns. The current vs. temperature curves for three different wafers were determined. The sheet resistance of the P+ diffusion, was measured at 10 percent below the nominal value for this lot. This accounts for most of the difference between the measured current of 107 μa and the design value of 100 μa for the nominal poly. For a wafer with a measured DL=+0.44 μm, the current calculated from FIG. 12 was 87% ofthe nominal value, and the measured current was 84% of the nominal. For a wafer with a measured DL=0.22 μm, the calculated current was 105% nominal, and the measured current was 114% of the nominal. For the nominal poly, the maximum variation of current over the temperature range 10° C.-120° C. was 2.1%. From 25° C.-120° C. it is 1.5%. Both the narrow and wide poly had similar temperature variations of their current.

The foregoing has shown that in the present technique the temperature coefficient of current can be selected to be either zero (nominally, as second order effects give a slight curvature), positive, or negative. If a zero temperature coefficient of current is desired, the resulting controlled current can be readily maintained within ±5 percent, and typically within ±2 percent, of the average value, over a temperature range of from 0° C. to 100° C., or even wider. These values are even more readily obtained over a typical commercial temperature range of from 0° C. to 70° C. The current source automatically compensates for variations in the transistor process, with a "fast" process giving lower current and a "slow" one giving a higher current. If desired, this compensation can be reduced or eliminated with respect to variations in the polysilicon line width size by proper resistor design. While the above example has been for a MOSFET, similar considerations apply for junction field effect transistors. In addition, Shottky gate field effect transistors (e.g., MESFETS) implemented in gallium arsenide or other III-V materials can be utilized with the present technique. Note that if processing compensation only is desired (i.e., without choosing a desired TC), then the circuitry associated with causing the channel current of the reference transistor to be proportional to the reference current (e.g., the current mirrors) can be omitted.

While the present invention may be used in analog integrated circuits, it may also be used in digital integrated circuits. For example, in certain random acces memory designs, it is known to use a current source for the sense amplifiers, for improved speed and sensitivity. In addition, the use of a controlled current source is known for use with digital logic circuits to reduce chip-to-chip performance variations. In the past, the current source associated with the logic gates has been controlled using a reference clock and comparator circuitry; see "Delay Regulation—A Circuit Solution to the Power/Performance Tradeoff", E. Berndlmaier et al, *IBM Journal of Research and Development*, Vol. 25, pp. 135-141 (1981). The present invention can advantageously be implemented on the same chip or wafer as the logic gates to perform this function. Since processing conditions are similar for all circuits on a given semiconductor wafer, the present technique lends itself to wafer scale integration uses. If desired, a single bias circuit (e.g., FIG. 4) can provide control of a plurality of current output transistors (FIGS. 5, 6) located at various places on a chip or wafer. The term "integrated circuit" as used herein includes both utilizations. The controlled current from the present source can be used to produce a controlled voltage, as by passing it through a resistor having a given temperature coefficient, or through a resistor-diode combination; i.e., a band-gap reference, etc. The characteristics of a band-gap reference are described in "New Developments in IC Voltage Regulators", R. J. Widlar, *IEEE Journal of Solid State Circuits,* Vol. SC-6, pp. 2–7 (1971). Since the controlled current can have a desired temperature coefficient chosen over a wide range, the resulting voltage can be used for a variety of purposes. Also, the device receiving the controlled current may be formed on a different substrate from the current source. For example, an optical emitter (e.g., light emitting diode or laser diode) can be driven by current supplied from the present source and adjusted so that $I_R$ has a positive T.C., to compensate for the reduction in optical output from the source with increasing temperature. Still other applications will be apparent to a person of skill in the art.

APPENDIX

Referring to the current source shown in FIG. 3; define a reference current $I_R$ as the current through R1, IDS3 as the current through M3 with gate to source voltage VSG3, and $KI_R$ as the current through M4, where K is the feedback constant determined by the relative sizes of M1, M2, M4, and M5. The value of K shown in FIG. 3 is two, but it may be any value consistent with stability. Summing the currents at the drain of M4 gives:

$$IDS3=(K-1)I_R. \qquad (1A)$$

However:

$$I_R = \frac{VGS3}{R1} = \frac{1}{R1}\left(\frac{2IDS3}{\beta}\right)^{\frac{1}{2}} + \frac{V_t}{R1}. \qquad (2A)$$

Substituting (1A) into (2A) and rearranging gives:

$$I_R - \frac{1}{R1}\left(\frac{2(K-1)}{\beta}\right)^{\frac{1}{2}}(I_R)^{\frac{1}{2}} - \frac{V_t}{R1} = 0 \qquad (3A)$$

which is quadratic in $(I_R)^{\frac{1}{2}}$. Solving gives:

$$(I_R)^{\frac{1}{2}} = \frac{1}{2R1}\left(\frac{2(K-1)}{\beta}\right)^{\frac{1}{2}} \pm \frac{1}{2}\left(\frac{1}{R1^2}\left(\frac{2(K-1)}{\beta}\right) + \frac{4V_t}{R1}\right)^{\frac{1}{2}}. \qquad (4A)$$

Squaring and rearranging gives:

$$I_R = \frac{V_t}{R1} + \frac{(K-1)}{R1^2\beta}\left(1 \pm \left(1 + \frac{2V_tR1\beta}{(K-1)}\right)^{\frac{1}{2}}\right). \qquad (5A)$$

As can be seen in (5A), there are two real solutions; however, the solution with the negative sign in the bracket is a class of solutons for VGS3<Vt, or zero current through M3. These solutions correspond to loss of regulation in the source. For $R1\beta/(K-1)>>1$, Equation (5A) reduces to:

$$I_R \approx V_t/R1 \qquad (6A)$$

which has an inherent negative temperature coefficient. For $R1\beta/(K=1)<<1$, Equation (5A) reduces to:

$$I_R \approx 2(K-1)/R1^2\beta$$

which has an inherent positive temperature coefficient. Even through $1/R1^2$ has negative temperature behavior, it is outweighted by $1/\beta$ which goes as $T^{3/2}$. It can also be shown that if at 25° C., $R1\beta/(K-1)\approx 2$, then $$\left.\frac{\partial I_R}{\partial T}\right|_{25^\circ\text{ C.}} \approx 0 \qquad (7A)$$

and that $I_R$ at this value of $R1\beta/(K-1)$ varies slowly with temperature.

The temperature behavior of this current source can be varied negative or positive, or made essentially zero, by proper choices of value of the reference resistor, R1, the size of transistor M3, and the value of the feedback constant K. Note that these factors influence the channel current through the reference transistor, as indicated by (1A).

What is claimed is:

1. An integrated circuit comprising a current source adapted to provide a controlled current to at least one device, characterized in that said current source comprises a reference field effect transistor having a gate electrode connected to a source electrode by means of a reference resistor, means for causing a reference current to flow through said reference resistor in proportion with the current that flows through the channel of said reference transistor, and means for causing said controlled current to be proportional to said reference current, wherein said current source obtains a desired variation in said reference current as a function of temperature by selecting the magnitude of at least one of: the threshold of said reference transistor (Vt); the gain of said reference transistor ($\beta$); and the channel current (I) flowing in said reference transistor.

2. The integrated circuit of claim 1 wherein said selecting is accomplished according to the formula:

$$I_R\cdot R = Vt + (2I/\beta_o)^{\frac{1}{2}}(T/To)^{\frac{3}{4}}$$

where:

$I_R$ is the magnitude of said reference current,

R is the magnitude of said reference resistor,

Vt is the threshold voltage of said reference transistor,

I is the channel current flowing in said reference transistor, $\beta_o$ is the gain of said reference transistor at a reference temperature To, and T is the temperature of said reference transistor.

3. The integrated circuit of claim 1 wherein said integrated circuit comprises at least one field effect transistor of a first channel conductivity type, and at least one transistor having a channel conductivity type opposite said first type.

4. The integrated circuit of claim 1 wherein said integrated circuit is formed in a semiconductor substrate comprising at least one first region of said first conductivity type having a plurality of field effect transistors formed therein, and further comprising a second region of said second conductivity type wherein said control field effect transistor is formed, with said second region being isolated by a p-n junction from the region wherein the other of said field effect transistors are formed.

5. The integrated circuit of claim 4 wherein the source of said control field effect transistor is electrically connected to said isolation region.

6. The integrated circuit of claim 1 wherein said field effect transistors are metal-oxide-silicon field effect transistors.

7. The integrated circuit of claim 1 wherein said reference field transistor has its back-gate electrode connected to a reference voltage.

8. The integrated circuit of claim 1 wherein said reference resistor has a resistance in the range of 100 ohms to 10 megaohms.

9. The integrated circuit of claim 1 wherein said reference resistor has a size defined at least in part by a layer of material that also comprises the gate electrode of said field effect transistor.

10. The integrated circuit of claim 9 wherein said material comprises polysilicon.

11. The integrated circuit of claim 9 wherein said material comprises a metal silicide.

12. The integrated circuit of claim 1 wherein said at least one device that is provided with said controlled current is a solid state device formed on the same semiconductor substrate as said current source.

13. The integrated circuit of claim 12 wherein an operational amplifier comprises said device that receives a controlled current.

14. The integrated circuit of claim 12 wherein a comparator comprises said device that receives a controlled current.

15. The integrated circuit of claim 12 wherein said at least one device that receives a controlled current is included in at least one logic circuit.

16. The integrated of claim 12 wherein said at least one device that receives a controlled current produces therefrom a controlled voltage having a desired temperature coefficient.

17. The integrated circuit of claim 1, wherein said integrated circuit is formed on a separate substrate from said device.

18. The integrated circuit of claim 1 wherein said integrated circuit is adapted to provide said controlled current to an optical emitter.

19. The integrated circuit of claim 1 wherein said controlled current has a positive temperature coefficient over a desired range of operating temperatures.

20. The integrated circuit of claim 1 wherein said controlled current has a negative temperature coefficient over a desired range of operating temperatures.

21. The integrated circuit of claim 1 wherein said controlled current has an approximately zero temperature coefficient over a desired range of operating temperatures.

22. The integrated circuit of claim 1 wherein said controlled current varies less than plus or minus five percent of its average value over a temperature range of from 0° to 100° C.

* * * * *